United States Patent
Lee et al.

(10) Patent No.: US 7,417,917 B2
(45) Date of Patent: Aug. 26, 2008

(54) COLUMN DECODER OF SEMICONDUCTOR MEMORY DEVICE, AND METHOD OF GENERATING COLUMN SELECTION LINE SIGNAL IN SEMICONDUCTOR MEMORY DEVICE

(75) Inventors: Wol-jin Lee, Yongin-si (KR); Jae-woong Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 141 days.

(21) Appl. No.: 11/590,703

(22) Filed: Oct. 31, 2006

(65) Prior Publication Data
US 2007/0115750 A1   May 24, 2007

(30) Foreign Application Priority Data
Nov. 23, 2005   (KR) ...................... 10-2005-0112199

(51) Int. Cl.
*G11C 8/00* (2006.01)
(52) U.S. Cl. ................................ 365/230.06; 365/233.1
(58) Field of Classification Search ............ 365/230.06, 365/233.1, 194
See application file for complete search history.

(56) References Cited
U.S. PATENT DOCUMENTS

| | | | |
|---|---|---|---|
| 5,654,935 A | * | 8/1997 | Hisada et al. ............ 365/233.5 |
| 5,848,020 A | * | 12/1998 | Mori ...................... 365/230.06 |
| 5,848,024 A | * | 12/1998 | Cho ....................... 365/230.06 |
| 6,839,291 B2 | * | 1/2005 | Shin ........................... 365/194 |

FOREIGN PATENT DOCUMENTS

| | | |
|---|---|---|
| JP | 2002-025255 | 1/2002 |
| JP | 2002-197871 | 7/2002 |
| KR | 10-2001-0070296 | 7/2001 |
| KR | 10-2005-0059948 | 6/2005 |

* cited by examiner

*Primary Examiner*—Anh Phung
(74) *Attorney, Agent, or Firm*—F. Chau & Associates, LLC

(57) ABSTRACT

A column decoder of a semiconductor memory device includes an internal address output circuit, an address decoder, and a control circuit. The internal address output circuit converts an external column address into an internal column address and outputs the internal column address. The address decoder decodes a pre-decoded column address, which is obtained by decoding the internal column address, in response to a write column enable signal or in response to a read column enable signal activated earlier than the write column enable signal, and generates a column selection line signal for activating a memory cell designated by the external column address. The control circuit outputs a write signal or a read signal for controlling an output time of the internal column address. The address decoder generates a valid column selection line signal in response to a write signal in the write operation, and generates a valid column selection line signal in response to the read signal in a read operation.

11 Claims, 4 Drawing Sheets

COLUMN DECODER OF SEMICONDUCTOR MEMORY DEVICE, AND METHOD OF GENERATING COLUMN SELECTION LINE SIGNAL IN SEMICONDUCTOR MEMORY DEVICE

CROSS-REFERENCE TO RELATED PATENT APPLICATION

This application claims priority to Korean Patent Application No. 10-2005-0112199, filed on Nov. 23, 2005, in the Korean Intellectual Property Office, the disclosure of which is incorporated by reference herein in its entirety.

BACKGROUND OF THE INVENTION

1. Technical Field

The present disclosure relates to a semiconductor memory device, and more particularly, to a column decoder of a semiconductor memory device and a method of generating a column selection line signal in the semiconductor memory device.

2. Discussion of the Related Art

In general, a semiconductor memory device such as DRAM includes a memory cell array for storing data. A memory cell in the memory cell array is designated (or selected) by a row address and a column address so data can be read from the memory cell and written to the memory cell.

Semiconductor memory devices select the row address and the column address by decoding an address of a memory cell applied together with a write command or a read command. In general, a column selection line is used for selecting the column address. A column decoder used for activating the column selection line, includes a pre-decoder and a main decoder.

FIG. 1 is a timing diagram showing the operation of a column decoder of a semiconductor memory device according to the prior art.

A pre-decoded column address DCAi is a signal obtained by a pre-decoder of a semiconductor memory device by decoding an internal column address and used with a read operation and a write operation of the semiconductor memory device. The pre-decoded column address DCAi is synchronized with a rising edge of an external clock signal CLK.

The main decoder of the semiconductor memory device activates the column selection line signal (not shown) by combining logic states of the pre-decoded column address DCA<1> valid in the read operation and the read column enable signal R_CSLE activated to a high level. The column selection line signal activates the column selection line of the semiconductor memory device.

In addition, the main decoder of the semiconductor memory device activates the column selection line signal by combining logic states of the pre-decoded column address DCA<1> valid in the write operation and the write column enable signal W_CSLE activated to a high level.

In the read operation of the semiconductor memory device, the read column enable signal R_CSLE for enabling (or activating) the main decoder of the semiconductor memory device is activated to a high level in the time interval of the valid pre-decoded column address DCA<1>. The read column enable signal R_CSLE is activated to a high level in synchronization with (or in response to) the rising edge of the first cycle CLK1 of an external clock signal CLK applied from outside the semiconductor memory device, and deactivated to a low level in synchronization with the rising edge of the second cycle CLK2 of the external clock signal CLK.

The time interval from the rising edge of the first cycle CLK1 to the time when the read column enable signal R_CSLE is activated to a high level is an absolute timing margin ATM_R, and is a fixed time interval independent of the operating frequency of the semiconductor memory device, which is needed for the read operation.

In the write operation of the semiconductor memory device, the write column enable signal W_CSLE for activating the main decoder of the semiconductor memory device is activated to a high level in the time interval of the valid pre-decoded column address DCA<1>. The write column enable signal W_CSLE is activated to a high level in synchronization with the rising edge of the first cycle CLK1 of the external clock signal CLK, and is deactivated to a low level in synchronization with the rising edge of the second cycle CLK2 of the external clock signal CLK. The time interval during which the write column enable signal has the high level is the same as the time interval during which the read column enable signal has the high level.

The time interval from the rising edge of the first cycle CLK1 to the time when the write column enable signal W_CSLE is activated to a high level is an absolute timing margin ATM_W and is a fixed time interval independent of the operating frequency of the semiconductor memory device, which is needed for the write operation.

The read operation of the semiconductor memory device is quicker than the write operation, because the data read path of the read operation is shorter than the data write path of the write operation, so the absolute timing margin of the read operation ATM_R is shorter than the absolute timing margin of the write operation ATM_W.

The time interval from the time when the read column enable signal R_CSLE is deactivated to a low level to the rising edge of the third cycle CLK3 of the external clock signal CLK is a read frequency timing margin FTM_R, and is a variable time interval dependent on the operating frequency of the semiconductor memory device. The higher the operating frequency of the semiconductor memory device, the shorter the read frequency timing margin.

Similarly, the time interval from the time when the write column enable signal W_CSLE is deactivated to a low level to the rising edge of the third cycle CLK3 of the external clock signal CLK is a write frequency timing margin FTM_W, and is a variable time interval dependent on the operating frequency of the semiconductor memory device. The higher the operating frequency of the semiconductor memory device, the shorter the write frequency timing margin.

Since the absolute timing margin of the write operation ATM_W is longer than the absolute timing margin of the read operation ATM_R, the write frequency timing margin FTM_W is shorter than the read frequency timing margin FTM_R.

Accordingly, when the operating frequency of the semiconductor memory device is relatively high, for example 800 MHz, an invalid pre-decoded column address DCA<2> can be decoded in response to the write column enable signal W_CSLE at a high level. As a consequence, since an invalid column selection line signal is generated, the write operation of the semiconductor memory device may malfunction.

SUMMARY OF THE INVENTION

According to an exemplary embodiment of the present invention, there is provided a column decoder of a semiconductor memory device including: an internal address output circuit converting an external column address into an internal column address and outputting the internal column address;

an address decoder decoding a pre-decoded column address, which is obtained by decoding the internal column address, in response to a write column enable signal or in response to a read column enable signal activated earlier than the write column enable signal, and generating a column selection line signal for activating a memory cell designated by the external column address; and a control circuit outputting a read signal or a write signal for controlling an output time of the internal column address, wherein the address decoder generates a valid column selection line signal in response to the write signal in a write operation and generates a valid column selection line signal in response to the read signal in a read operation.

The control circuit may include: a command decoder decoding external control signals and outputting an internal write signal or the read signal; and a delay circuit outputting the write signal by delaying the internal write signal by a predetermined delay time. The external control signals may include a chip selection signal, a row address strobe signal, a column address strobe signal, and a write enable signal.

According to exemplary embodiment of the present invention, there is provided a method of generating a column selection line signal in a semiconductor memory device, the method including: upon determining whether a command is a write command, generating a write signal by delaying an internal write signal by a predetermined delay time, wherein the write signal is obtained by decoding the write command provided from outside the semiconductor memory device; latching a first internal column address after delaying the first internal column address by the predetermined delay time according to the write signal, and generating a second internal column address; and decoding a pre-decoded column address, which is obtained by decoding the second internal column address, according to a write column enable signal activated in a write operation, and generating a valid column selection line signal.

The method of generating the column selection line signal in the semiconductor memory device may include: upon determining whether the command is a read command, generating a read signal by decoding the read command; latching the first internal column address without delay according to the read signal, and generating the second internal column address; and decoding a pre-decoded column address, which is obtained by decoding the second internal column address, according to a read column enable signal activated in a read operation, and generating a valid column selection line signal.

The write column enable signal may be activated later than the read column enable signal. The command may include a chip selection signal, a row address strobe signal, a column address strobe signal, and a write enable signal.

BRIEF DESCRIPTION OF THE DRAWINGS

The embodiments of the present invention will become more apparent by describing in detail exemplary embodiments thereof with reference to the attached drawings in which.

DETAILED DESCRIPTION OF EXEMPLARY EMBODIMENTS

Figure 2:
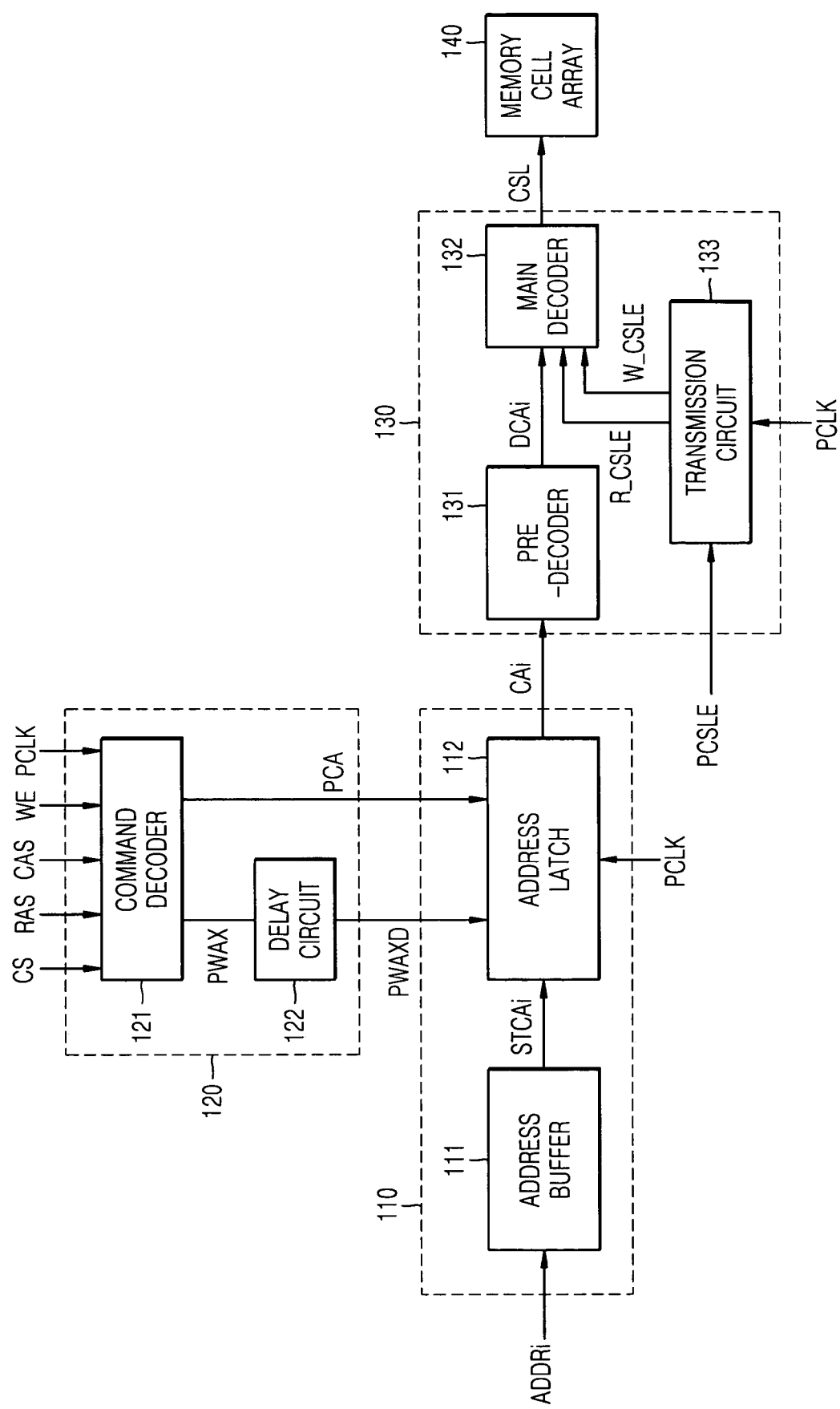
FIG. 2 is a block diagram of a semiconductor memory device including a column decoder according to an exemplary embodiment of the present invention.

Hereinafter, exemplary embodiments of the present invention will be described in detail with reference to the accompanying drawings. This invention may, however, be embodied in many different forms and should not be construed as limited to the embodiments set forth herein. Like reference numerals denote like elements in the drawings. FIG. 2 is a block diagram of a semiconductor memory device 100 including a column decoder according to an exemplary embodiment of the present invention. The semiconductor memory device 100 includes an internal address output circuit 110, a control circuit 120, an address decoder 130, and a memory cell array 140. The column decoder includes the internal address output circuit 110, the control circuit 120, and the address decoder 130.

The internal address output circuit 110 includes an address buffer 111 and an address latch 112. The internal address output circuit 110 converts an external column address ADDRi into an internal column address and outputs the internal column address.

The address buffer 111 outputs a CMOS level first internal column address STCAi by buffering a TTL level external column address ADDRi.

During a write operation of the semiconductor memory device 100, for writing data to the memory memory cell array 140, the address latch 112 delays the first internal column address STCAi by a predetermined time and latches the cell of the delayed first internal column address STCAi in response to a write signal PWAXD, and outputs the second internal column address CAi synchronized with the internal clock signal PCLK. The internal clock signal PCLK is synchronized with the external clock signal CLK shown in FIG. 1, and is generated by a delay locked loop circuit (not shown) of the semiconductor memory device 100.

During a read operation of the semiconductor memory device 100, for reading data stored in the memory cell of the memory cell array 140, the address latch 112 latches the first internal column address STCAi without delaying the first internal column address, in response to a read signal PCA, and outputs the second internal column address CAi synchronized with the internal clock signal PCLK.

The control circuit 120 includes a command decoder 121 and a delay circuit 122. The control circuit 120 outputs the write signal PWAXD or the read signal PCA for controlling the output time of the second internal column address CAi, so that the address decoder 130 may generate a valid column selection line signal CSL in the write operation or in the read operation.

Figure 1:
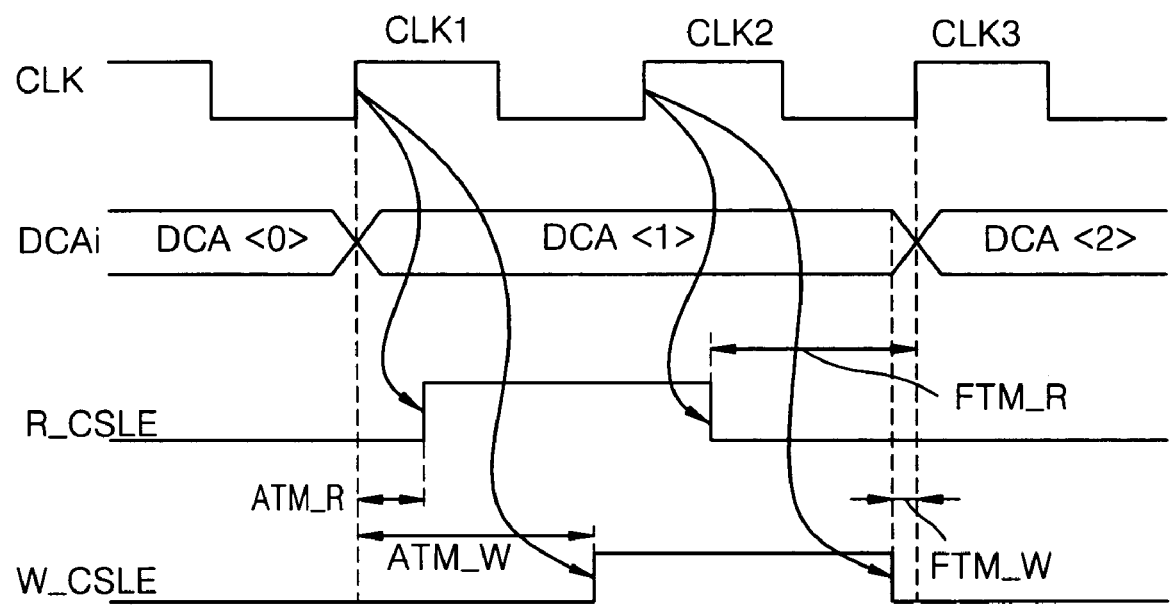
FIG. 1 is an example of a timing diagram showing the operation of a column decoder of a semiconductor memory device according to conventional techniques.

Since the write column enable signal W_CSLE is activated later than the read column enable signal as explained in FIG. 1, the control circuit synchronizes the valid pre-decoded column address DCAi with the write column enable signal W_CSLE by outputting the write signal PWAXD for controlling the second internal column address CAi so that the second internal column address CAi may be delayed for the delay time before being output. The write signal PWAXD is the delayed signal of an internal write signal PWAX for the predetermined time.

The control circuit 120 outputs the read signal PCA without delay, like the conventional column decoder, so as to synchronize the valid pre-decoded column address DCAi with the read column enable signal R_CSLE. Unlike the conventional column decoder which uses the write column address and the read column address with the same timing, the control circuit 120 controls the timing of the write column address and the timing of the read column address to be different by delaying the write column address related to the second internal column address CAi for the delay time, or by not delaying the read column address related to the second internal column address CAi. Therefore, the control circuit 120 can control the timing of the write frequency and the timing of the read frequency in the operation of the semiconductor memory device at a high frequency so that the timing margin of the write frequency and the timing margin of the read frequency may be satisfied.

The command decoder 121 combines (or decodes) logic states of the external control signals CS, RAS, CAS, and WE supplied from outside the semiconductor memory device 100 to output the internal write signal PWAX or the read signal PCA. The read signal PCA controls the read operation of the semiconductor memory device 100. The internal write signal PWAX and the read signal PCA are synchronized with the internal clock signal PCLK.

The external control signals CS, RAS, CAS, and WE constitute a command such as a write command or a read command supplied from outside the semiconductor memory device 100, and include a chip selection signal CS, a row address strobe signal RAS, a column address strobe signal CAS, and a write enable signal WE. The chip selection signal CS activates or deactivates the semiconductor memory device 100, and the row address strobe signal RAS indicates that the row address signal is applied. The column address strobe signal CAS indicates that the column address signal is applied, and the write enable signal WE activates the write operation of the semiconductor memory device 100.

The delay circuit 122 generates the write signal PWAXD delayed for the delay time. The write signal PWAXD controls the write operation of the semiconductor memory device. The delay time is needed so that the main decoder 132 in the address decoder 130 can generate a valid column selection line signal CSL.

The address decoder 130 includes a pre-decoder 131, a main decoder 132, and a transmission circuit 133. The address decoder 130 decodes (or main-decodes) the pre-decoded column address DCAi decoded (or pre-decoded) from the second internal column address CAi in response to the write column enable signal W_CSLE activated in the write operation, or in response to the read column enable signal R_CSLE activated in the read operation, and generates a column selection line signal CSL for activating the memory cell in the memory cell array 140 designated by the external column address ADDRi.

The pre-decoder 131 includes a plurality of AND gates, and outputs the pre-decoded column address DCAi, which is obtained by decoding the second internal column address CAi.

The transmission circuit 133 outputs the write column enable signal W_CSLE or the read column enable signal R_CSLE with the delay of the column enable signal PCSLE generated on the basis of the logic states of external control signals CS, RAS, CAS, and WE.

The transmission circuit 133 includes a write inverter chain (not shown) for outputting the write column enable signal W_CSLE, and a read inverter chain (not shown) for outputting the read column enable signal R_CSLE. The write inverter chain and the read inverter chain operate in response to the internal clock signal PCLK. The signal transmitted through the write inverter chain is delayed more than the signal transmitted through the read inverter chain, because the semiconductor memory device 100 performs the read operation faster than the write operation. The data read path in the read operation is shorter than the data write path in the write operation.

The main decoder 132 includes a NAND gate. The main decoder 132 decodes the pre-decoded column address DCAi in response to the write column enable signal W_CSLE activated in the write operation or in response to the read column enable signal R_CSLE activated in the read operation, and outputs the valid column selection line signal CSL.

Figure 3:
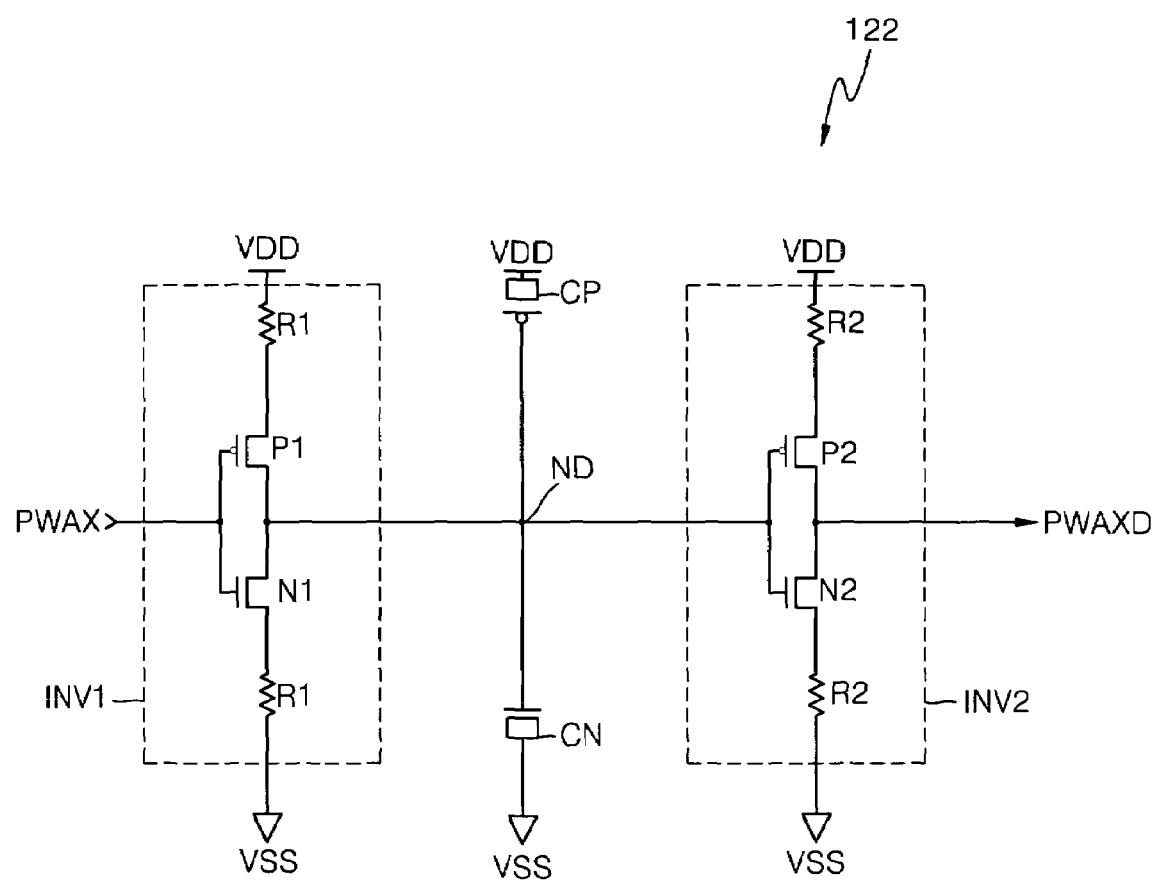
FIG. 3 is a circuit diagram of a delay circuit shown in FIG. 2.

FIG. 3 is a circuit diagram of a delay circuit shown in FIG. 2. Referring to FIG. 3, the delay circuit 122 includes a first inverter INV1, a second inverter INV2, a PMOS capacitor CP, and an NMOS capacitor CN.

The delay circuit 122 outputs the internal write signal PWAXD delayed for the delay time by resistors R1 in the first inverter INV1, resistors R2 in the second inverter INV2, the PMOS capacitor CP, and the NMOS capacitor CN. The capacitance of the PMOS capacitor may be substantially the same as that of the NMOS capacitor.

The first inverter INV1 includes a PMOS transistor P1 with a source connected to a power supply voltage VDD through the resistors R1 and an NMOS transistor N1 with a source connected to a ground voltage VSS through the resistors R1. The first inverter INV1 inverts and delays the internal write signal PWAX.

The second inverter INV2 includes a PMOS transistor P2 with a source connected to a power supply voltage VDD through the resistors R2 and an NMOS transistor N2 with a source connected to a ground voltage VSS through the resistors R2. The second inverter INV2 inverts and delays the output signal of the first inverter INV1 to output the write signal PWAXD.

A PMOS capacitor CP includes one terminal connected to the output terminal ND of the first inverter and the other terminal connected to the power supply voltage VDD, and an NMOS capacitor CN includes one terminal connected to the output terminal ND of the first inverter and the other terminal connected to the ground voltage VSS.

Figure 4:
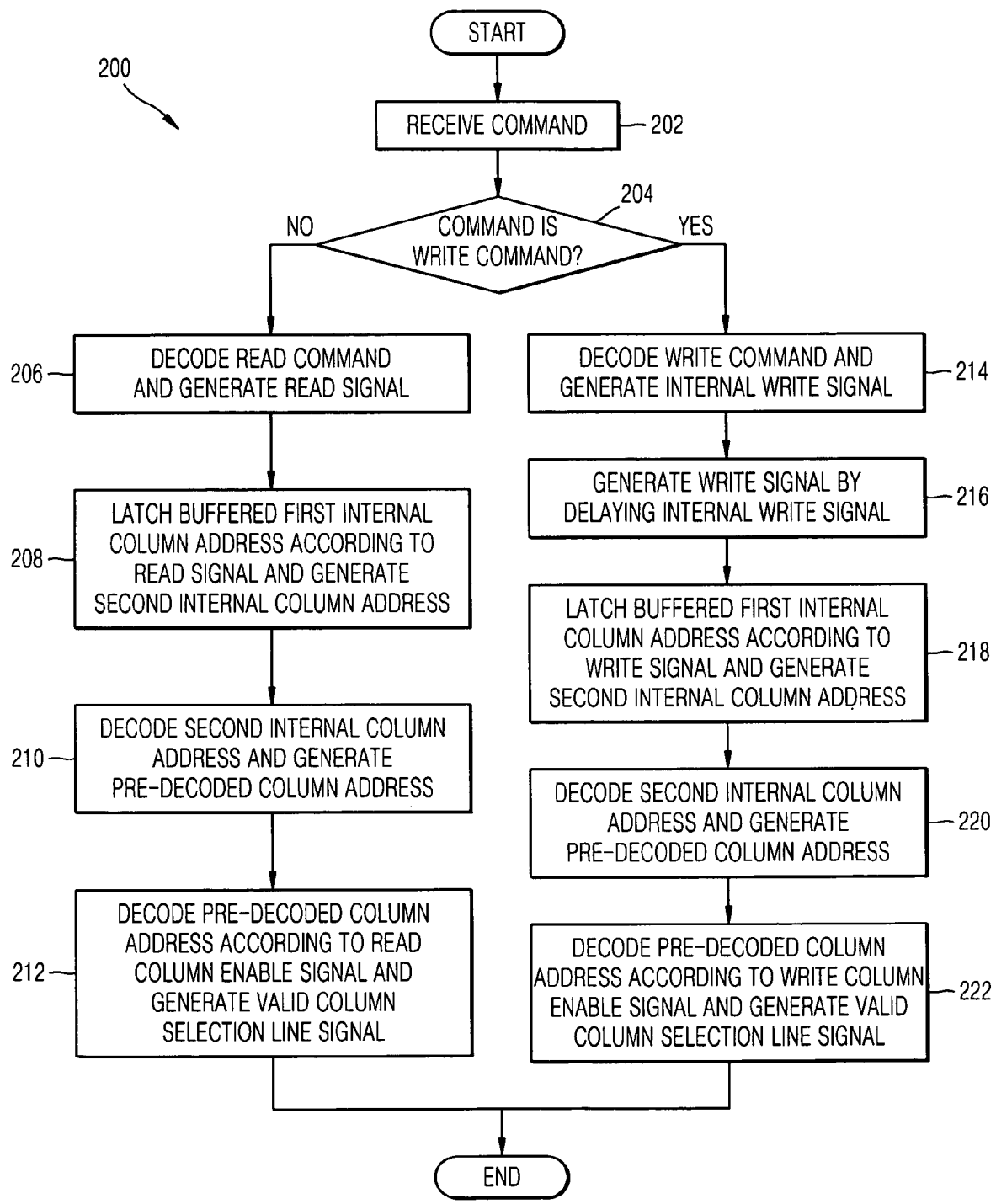
FIG. 4 is a flow chart showing a method of generating a column selection line signal in a semiconductor memory device according to an exemplary embodiment of the present invention.

FIG. 4 is a flow chart showing a method of generating a column selection line signal in a semiconductor memory device according to an exemplary embodiment of the present invention. The method of generating a column selection line signal (200) shown in FIG. 4 can be applied to the column decoder of the semiconductor memory device 100 shown in FIG. 2.

According to operation 202, the command decoder 121 receives the command including the external control signals CS, RAS, CAS, and WE supplied from outside the semiconductor memory device 100. The chip selection signal CS activates or deactivates the semiconductor memory device 100, and the row address strobe signal RAS indicates that the row address signal is applied. The column address strobe signal CAS indicates that the column address signal is applied, and the write enable signal WE activates the write operation of the semiconductor memory device 100.

According to operation 204, the command decoder 121 determines whether the received command is the write command. If it is determined in operation 204 that the received command is not the write command but the read command, the process proceeds to operation 206. If it is determined in operation 204 that the received command is the write command, the process proceeds to operation 214.

According to operation 206, the command decoder 121 generates the read signal PCA by decoding the external control signals CS, RAS, CAS, and WE constituting a read command. The read signal PCA controls the read operation of the semiconductor memory device 100.

According to operation 208, the address latch 112 latches the first internal column address STCAi buffered by the address buffer 111 without delay according to the read signal PCA, and generates the second internal column address CAi.

According to operation 210, the pre-decoder 131 generates the pre-decoded column address DCAi by decoding the second internal column address CAi.

According to operation 212, main decoder 132 decodes the pre-decoded column address DCAi according to the read column enable signal R_CSLE activated in the read operation, and generates the valid column selection line signal CSL. The valid column selection line signal CSL activates the memory cell designated by the external column address ADDRi corresponding to the pre-decoded column address DCAi.

According to operation 214, the command decoder 121 generates the internal write signal by decoding the external control signals CS, RAS, CAS, and WE constituting the write command.

According to operation 216, the delay circuit 122 generates the write signal PWAXD delayed by a predetermined delay time. The write signal PWAXD controls the write operation of the semiconductor memory device 100.

The delay time is needed for generating the valid column selection line signal CSL by the main decoder 132. Since the data read path in the read operation is shorter than the data write path in the write operation, the write column enable signal W_CSLE for enabling the main decoder 132 in the write operation is activated later than the read column enable signal R_CSLE for enabling the main decoder 132 in the read operation. Therefore, operation 216 is needed for the method of generating the column selection line signal (200).

According to operation 218, the address latch 112 delays the first internal column address STCAi buffered by the address buffer 111 by the delay time and latches the delayed first internal column address STCAi according to the write signal PWAXD, and generates the second internal column address CAi.

According to operation 220, the pre-decoder 131 generates the pre-decoded column address DCAi by decoding the second internal column address CAi delayed for the delay time.

According to operation 222, the main decoder 132 decodes the pre-decoded column address DCAi according to the write column enable signal W_CSLE activated in the write operation, and generates the valid column selection line signal CSL. The valid column selection line signal CSL activates the memory cell designated by the external column address ADDRi corresponding to the pre-decoded column address DCAi.

While the present invention has been particularly shown and described with reference to exemplary embodiments thereof, it will be understood by those skilled in the art that various changes in form and detail may be made therein without departing from the spirit and scope of the present invention as defined by the appended claims.

What is claimed is:

1. A column decoder of a semiconductor memory device comprising:
    an internal address output circuit converting an external column address into an internal column address and outputting the internal column address;
    an address decoder decoding a pre-decoded column address, which is obtained by decoding the internal column address, in response to a write column enable signal or in response to a read column enable signal activated earlier than the write column enable signal, and generating a column selection line signal for activating a memory cell designated by the external column address; and
    a control circuit outputting a read signal or a write signal for controlling an output time of the internal column address,
    wherein the address decoder generates a valid column selection line signal in response to the write signal in a write operation and generates a valid column selection line signal in response to the read signal in a read operation.

2. The column decoder of claim 1, wherein the control circuit comprises:
    a command decoder decoding external control signals and outputting an internal write signal or the read signal; and
    a delay circuit outputting the write signal by delaying the internal write signal by a predetermined delay time.

3. The column decoder of claim 2, wherein the external control signals include a chip selection signal, a row address strobe signal, a column address strobe signal, and a write enable signal.

4. The column decoder of claim 2, wherein the internal address output circuit comprises:
    an address buffer buffering the external column address and outputting a buffered internal column address; and
    an address latch latching the buffered internal column address after delaying the buffered internal column address by the delay time in response to the write signal, or latching the buffered internal column address without delay in response to the read signal, and outputting the internal column address.

5. The column decoder of claim 4, wherein the address decoder comprises:
    a pre-decoder decoding the internal column address and outputting the pre-decoded column address; and
    a main decoder decoding the pre-decoded column address in response to the write column enable signal or in response to the read column enable signal and outputting the valid column selection line signal.

6. The column decoder of claim 5, wherein the address decoder further comprises a transmission circuit outputting the write column enable signal or the read column enable signal by delaying a column enable signal generated on the basis of the logic states of the external control signals.

7. The column decoder of claim 2, wherein the delay circuit comprises:
    a first inverter inverting and delaying the internal write signal;
    a PMOS capacitor including a first terminal connected to an output terminal of the first inverter and a second terminal connected to a power supply voltage;
    an NMOS capacitor including a first terminal connected to the output terminal of the first inverter and a second terminal connected to a ground voltage; and
    a second inverter inverting and delaying an output signal of the first inverter and outputting the write signal.

8. A method of generating a column selection line signal in a semiconductor memory device, the method comprising:
    upon determining whether a command is a write command, generating a write signal by delaying an internal write signal by a predetermined time, wherein the write signal is obtained by decoding the write command provided from outside the semiconductor memory device;

latching a first internal column address after delaying the first internal column address by the predetermined delay time according to the write signal, and generating a second internal column address; and decoding a pre-decoded column address, which is obtained by decoding the second internal column address, according to a write column enable signal activated in a write operation, and generating a valid column selection line signal.

9. The method of claim 8, further comprising:

upon determining whether the command is a read command, generating a read signal by decoding the read command;

latching the first internal column address without delay according to the read signal and generating the second internal column address; and decoding a pre-decoded column address, which is obtained by decoding the second internal column address according to a read column enable signal activated in a read operation, and generating a valid column selection line signal.

10. The method of claim 9, wherein the write column enable signal is activated later than the read column enable signal.

11. The method of claim 10, wherein the command includes a chip selection signal, a row address strobe signal, a column address strobe signal, and a write enable signal.

* * * * *